United States Patent
Ohmi et al.

(10) Patent No.: US 8,217,270 B2
(45) Date of Patent: Jul. 10, 2012

(54) MULTILAYER CIRCUIT BOARD AND ELECTRONIC DEVICE

(75) Inventors: Tadahiro Ohmi, Miyagi (JP); Akinobu Teramoto, Miyagi (JP); Akihiro Morimoto, Miyagi (JP)

(73) Assignee: Tohoku University, Sendai-shi (JP)

( * ) Notice: Subject to any disclaimer, the term of this patent is extended or adjusted under 35 U.S.C. 154(b) by 1144 days.

(21) Appl. No.: 11/990,860

(22) PCT Filed: Aug. 18, 2006

(86) PCT No.: PCT/JP2006/316239
§ 371 (c)(1),
(2), (4) Date: Feb. 22, 2008

(87) PCT Pub. No.: WO2007/023742
PCT Pub. Date: Mar. 1, 2007

(65) Prior Publication Data
US 2009/0120673 A1    May 14, 2009

(30) Foreign Application Priority Data

Aug. 23, 2005  (JP) ................................ 2005-241059
Feb. 6, 2006  (JP) ................................ 2006-028655

(51) Int. Cl.
*H05K 1/03* (2006.01)
(52) U.S. Cl. ........................ 174/255; 174/260
(58) Field of Classification Search .................. None
See application file for complete search history.

(56) References Cited

U.S. PATENT DOCUMENTS 6,734,375 B2 * 5/2004 Kawakita et al. ............. 174/264
7,294,393 B2 * 11/2007 Murai et al. ............... 428/306.6
2003/0129440 A1 * 7/2003 Kawashima et al. ......... 428/626
2003/0214042 A1 11/2003 Miyazawa

FOREIGN PATENT DOCUMENTS

| JP | 62-169392 A | 7/1987 |
| JP | 7-202439 A | 8/1995 |
| JP | 2002-134925 | 5/2002 |
| JP | 2003-27035 A | 1/2003 |
| JP | 2003-323138 A | 11/2003 |
| JP | 2005-50860 A | 2/2005 |
| JP | 2005-116660 A | 4/2005 |
| WO | WO 2004/060660 A1 | 7/2004 |

OTHER PUBLICATIONS

Japanese Patent Office action on application No. 2006-028655 dated Jun. 22, 2011; pp. 1-3.

* cited by examiner

*Primary Examiner* — Ishwarbhai Patel
(74) *Attorney, Agent, or Firm* — Foley & Lardner LLP

(57) ABSTRACT

A multilayered circuit board which is provided with a low-permittivity interlayer insulating film, and which can significantly improve the performance such as signal transmission characteristics of the multilayered circuit board such as a package and a printed board, because the surface in contact with the interlayer insulating film of the circuit board has no unevenness to eliminate the lowering of production yield and the deterioration of high-frequency signal transmission characteristics; and electronic equipment using the circuit board. The multilayered circuit board comprises, mounted on a substrate, plural wiring layers and plural insulating layers positioned between the plural wiring layers, wherein at least part of the plural insulating layers are composed of a porous insulating layer containing at least any of materials selected from a porous material group consisting of porous material, aerogel, porous silica, porous polymer, hollow silica and hollow polymer, and a non-porous insulating layer formed on at least one surface of the porous insulating layer and not containing the porous material group.

10 Claims, 7 Drawing Sheets

US 8,217,270 B2
                        1                                                                  2
     MULTILAYER CIRCUIT BOARD AND                        the multilayer circuit board, such as a package or a printed
           ELECTRONIC DEVICE                             board because the surface is in contact with the interlayer insu-
                                                         lating film has no irregularities so that no reduction occurs in
   This application is the National Phase of PCT/JP2006/ production yield or no degradation occurs in high-frequency
316239, filed Aug. 18, 2006, which claims priority to Japa- signal transmission characteristics.
nese Application No. 2005-241059, filed Aug. 23, 2005 and    Further, it is another object of this invention to provide an
Japanese Application No. 2006-028655, filed Feb. 6, 2006, electronic device using the multilayer circuit board having the
the disclosures of which are hereby incorporated by reference foregoing advantage.
in their entirety.
                                                                          Means for Solving the Problem
             TECHNICAL FIELD
                                                             According to one aspect of this invention, there is provided
   This invention relates to a multilayer circuit board, and a multilayer circuit board which includes, on a base member,
particularly relates to a multilayer circuit board for use in plural of wiring layers and at least one insulating layer located
mounting thereon a large-scale integrated circuit element between the plural wiring layers. At least part of the insulating
(LSI) and so on of an electronic device and to an electronic layer includes a porous insulating layer and a non-porous
device using such a multilayer circuit board.           insulating layer formed on at least one surface of the porous
                                                         insulating layer. In the multilayer circuit board, the porous
             BACKGROUND ART                              insulating layer contains at least any of materials selected
                                                         from a porous material group consisting of a porous sub-
   A signal rise speed has increased due to an improvement in stance, an aerogel, a porous silica, a porous polymer, a hollow
operating speed of LSIs, such as central processing units silica, and a hollow polymer. The non-porous insulating layer
(CPUs) and, in a wiring in packages and printed boards where is free from the porous material group.
those LSIs are mounted and input/output signals propagate,   Herein, in the present invention, the porous insulating layer
fine wiring lines each having a width of about 1 µm to several and the non-porous insulating layer satisfy a relationship of
tens of µm have come to be often used in terms of a require- $\epsilon1/d1<\epsilon2/d2$, wherein a relative permittivity and a thickness
ment for an increase in wiring density. Inevitably, interlayer of the porous insulating layer are given by $\epsilon1$ and d1, respec-
insulating films in the packages and the printed boards have tively, and a relative permittivity and a thickness of the non-
also come to be required to decrease in permittivity in terms porous insulating layer are given by $\epsilon2$ and d2, respectively.
of shortening charge/discharge times.                   Preferably, the thickness d1 of the porous insulating layer and
   As a technique for reducing the permittivity of an interlayer the thickness d2 of the non-porous insulating layer satisfy a
insulating film of a multilayer circuit board such as a package relationship of d1>d2.
or a printed board, it is considered to carry out a reduction in   Furthermore, in the porous insulating layer used in the
permittivity by dispersing hollow particles or porous particles multilayer circuit board, it is preferable that the material
in a resin forming the interlayer insulating film or causing a selected from the porous material group is a particulate mate-
large number of pores to be contained in the resin. As such a rial having a diameter d satisfying $d<0.1\times dc$, where a mini-
technique, Patent Document 1 discloses a method of forming mum wiring thickness t1 or a minimum wiring width W1 of
a film mixed with the foregoing hollow particles or porous the wiring layer in contact with the insulating layer, which-
particles at a portion where the reduction in permittivity is to ever is smaller, is given by dc, and that the particulate material
be achieved.                                             is dispersed in a synthetic resin to thereby form the porous
   However, according to studies by the inventors of this insulating layer.
invention, if a technique described in Patent Document 1 is   In the present invention, it is preferable that the synthetic
simply applied to an interlayer insulating film forming a resin is at least one selected from the group consisting of an
package or a printed board, a large number of irregularities epoxy resin, a phenol resin, a polyimide resin, a polyester
are formed on a surface due to porous bodies, hollow par- resin, a fluorine resin, a denatured polyphenylether resin, a
ticles, or pores exposed on the surface and thus, in the pack- bismaleimide triazine resin, a denatured polyphenylene oxide
age or printed board wiring particularly required to be min- resin, a silicon resin, an acrylic resin, a benzocyclobutene
iaturized, a problem arises which includes pattern shape resin, a polyethylene naphthalate resin, a polycycloolefin
failure, such as disconnection or defect, and a problem also resin, a polyolefin resin, a cyanate ester resin, a melamine
arises that a current path in the wiring is prolonged due to resin, and an acrylic resin.
irregularities caused in the wiring by the foregoing irregulari-   In the multilayer circuit board according to this invention,
ties, thus leading to an increase in loss. Since Patent Docu- the insulating layer and the wiring layer have a relationship of
ment 1 refers to nothing about them and also describes noth- $R<0.5\times\delta$, where R represents a mean square surface rough-
ing about a relationship between the sizes or the like of the ness, formed in a wiring width direction, of a portion of the
wiring and the porous bodies to be dispersed/mixed, no solv- insulating layer that is in contact with a wiring line of the
ing method has been found from this document.          wiring layer and $\delta$ represents a skin depth of a current flowing
Patent Document 1: Japanese Unexamined Patent Applica- in the wiring line.
   tion Publication (JP-A) No. 2003-323138                  In the multilayer circuit board according to this invention,
                                                         it is preferable that signal attenuation in a microstrip line is 0.5
       DISCLOSURE OF THE INVENTION                       dB/cm or less at an operating frequency of 10 GHz.
                                                             According to another aspect of this invention, there is
        Problem to be Solved by the Invention            provided an electronic device which uses the multilayer cir-
                                                         cuit board described above.
   It is therefore an object of this invention to provide a
multilayer circuit board that comprises a low-permittivity                      Effect of the Invention
interlayer insulating film and that can significantly improve
the performance such as signal transmission characteristics of   According to a multilayer circuit board of this invention,
                                                         since a non-porous insulating film is formed at the surface, in contact with a wiring line, of a low-permittivity interlayer insulating film made of a porous substance, no reduction occurs in production yield or no degradation occurs in high-frequency signal transmission characteristics and, therefore, it is possible to significantly improve the performance, such as signal transmission characteristics of the multilayer circuit board, such as a package or a printed board.

Figure 1:
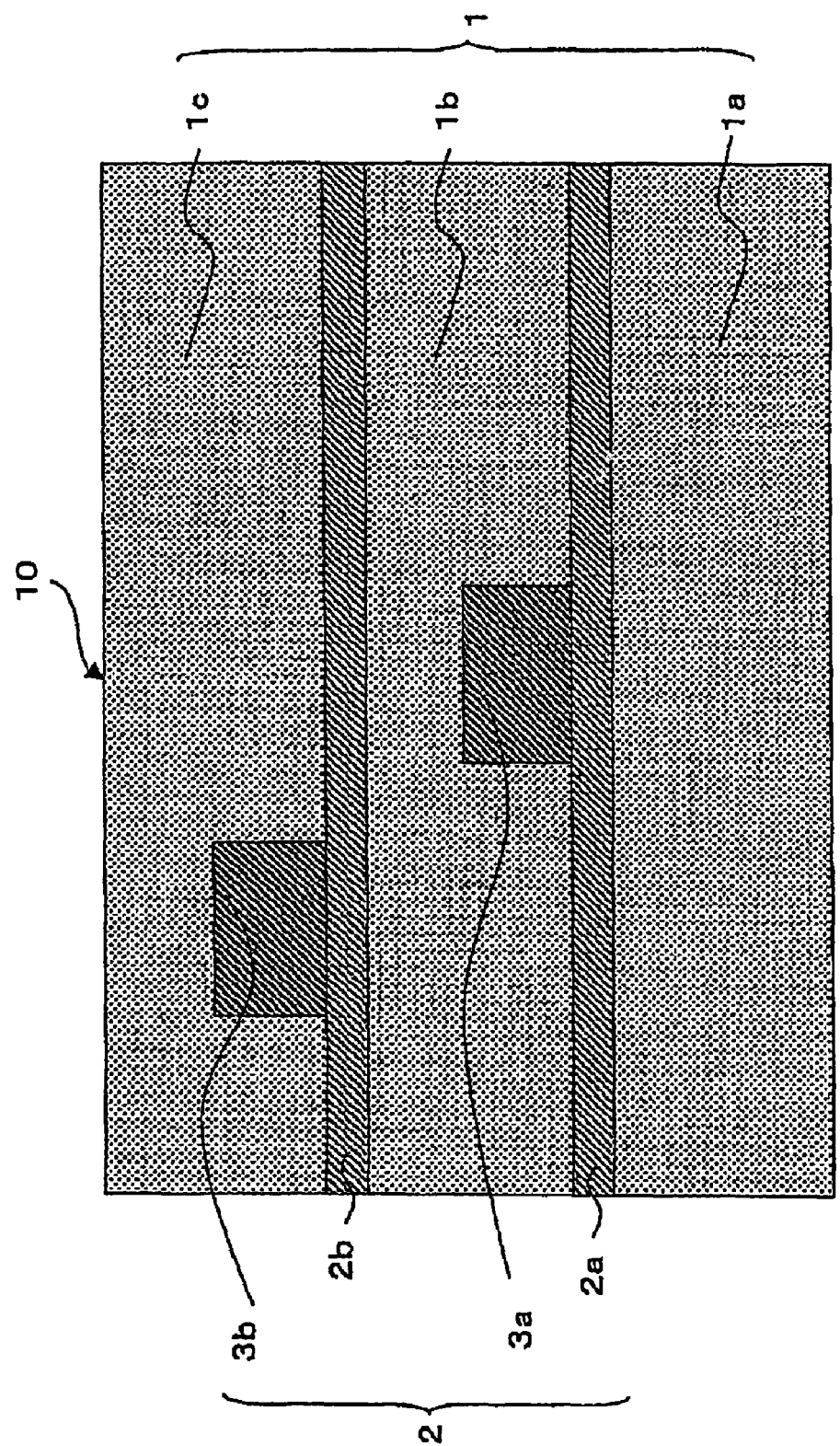
FIG. 1 is a sectional view showing one example of a basic structure of a multilayer circuit board of this invention.

DESCRIPTION OF SYMBOLS 1 porous insulating layer
$1a$ first porous insulating layer
$1b$ second porous insulating layer
$1c$ third porous insulating layer
2 non-porous insulating layer
$2a$ first non-porous insulating layer
$2b$ second non-porous insulating layer
$2c$ third non-porous insulating layer
3 wiring layer
$3a$ first wiring layer
$3b$ second wiring layer
$3c$ third wiring layer
$3d$ fourth wiring layer
4 core material
5 insulating layer
$5a$ first insulating layer
$5b$ second insulating layer
$5c$ third insulating layer
10, 15, 20 multilayer circuit board

BEST MODE FOR CARRYING OUT THE INVENTION

Hereinbelow, a description will be made as regards one example of a preferred embodiment of a multilayer circuit board according to this invention. This board is configured such that a non-porous insulating layer is formed on one side or both sides of a porous insulating layer containing a porous substance in its structure.

As schematically shown in FIG. 1, one of characteristic configurations in this invention is that, in a multilayer circuit board 10 having, on a base member, plural first and second wiring layers $3a$ and $3b$ (hereinafter represented by symbol 3 when not specifying the particular one) and plural insulating layers located between the plural first and second wiring layers $3a$ and $3b$, at least part of each insulating layer comprises a first, second, or third porous insulating layer $1a$, $1b$, or $1c$ (hereinafter represented by symbol 1 when not specifying the particular one) containing at least any of materials selected from a porous material group consisting of a porous substance, an aerogel, a porous silica, a porous polymer, a hollow silica, and a hollow polymer, and a first or second non-porous insulating layer $2a$ or $2b$ (hereinafter represented by symbol 2 when not specifying the particular one) formed on at least one surface of the first, second, or third porous insulating layer $1a$, $1b$, or $1c$ and not containing the porous material group.

With this configuration, since the porous material is not exposed at a interface between the wiring layer 3 laminated on the insulating layer and the insulating layer 2, it is possible to suppress occurrence of irregularities in the wiring caused by the porous material and thus to suppress pattern shape failure such as disconnection, defect, or swelling of the wiring.

In order to avoid degradation of characteristics of a signal propagating in the wiring with such a configuration, given that a relative permittivity and a thickness of the porous insulating layer 1 are $\epsilon1$ and $d1$, respectively, and the relative permittivity and the thickness of the non-porous insulating layer 2 are $\epsilon2$ and $d2$, respectively, it is preferable to satisfy a relationship of $\epsilon1/d1 < \epsilon2/d2$ and, further, it is preferable to satisfy a relationship of $d1 > d2$ between the thickness $d1$ of the porous insulating layer 1 and the thickness $d2$ of the non-porous insulating layer 2.

Figure 2:
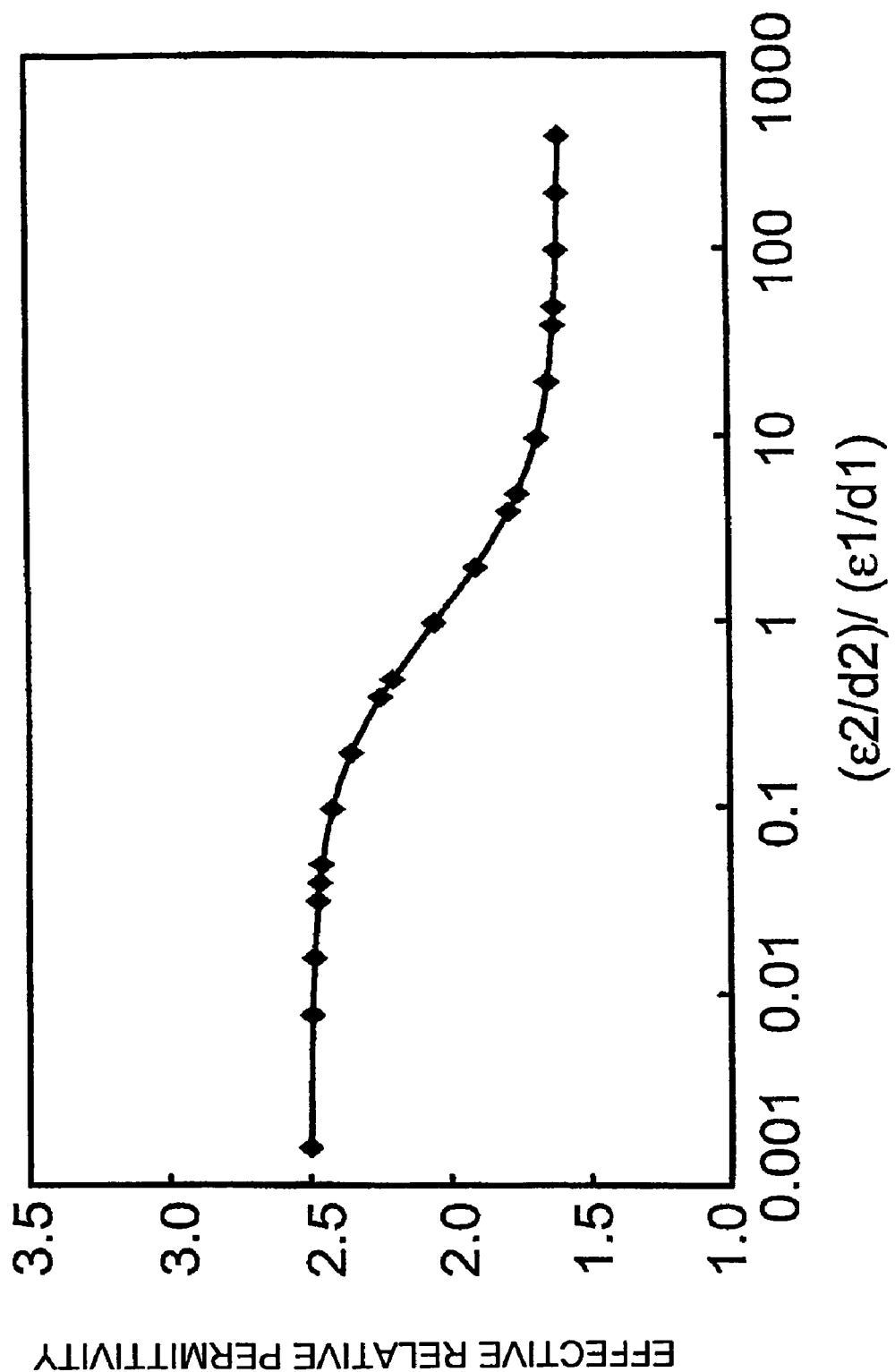
FIG. 2 is a diagram showing the relationship between the effective permittivity of a laminate and the ratio between ($\epsilon1/d1$) and ($\epsilon2/d2$) in the multilayer circuit board of this invention, wherein the relative permittivity and the thickness of each of porous insulating layers $1a$, $1b$, and $1c$ and the relative permittivity and the thickness of each of non-porous insulating layers $2a$, $2b$ are given by $\epsilon1$, $d1$ and $\epsilon2$, $d2$, respectively, and the non-porous insulating layers are laminated on the porous insulating layers, respectively.

This will be explained using FIG. 2. FIG. 2 shows a relationship between the effective permittivity of the laminate and the ratio between ($\epsilon1/d1$) and ($\epsilon2/d2$) in the multilayer circuit board of this invention, wherein the relative permittivity and the thickness of each of the porous insulating layers $1a$, $1b$, and $1c$ and the relative permittivity and the thickness of each of the non-porous insulating layers are given by $\epsilon1$, $d1$ and $\epsilon2$, $d2$, respectively, and the non-porous insulating layers $2a$, $2b$ are laminated on the porous insulating layers, respectively.

It is seen that when $\epsilon1/d1 < \epsilon2/d2$ (i.e. ($\epsilon2/d2$)/($\epsilon1/d1$)>1), it is possible to obtain a permittivity reduction effect in this invention. That is, it is possible to obtain the permittivity reduction effect while suppressing the influence of irregularities caused by the porous material.

Although the permittivity reduction effect tends to be obtained as the thickness $d2$ of the non-porous insulating layer decreases, this is not preferable because the influence of irregularities by the porous material tends to increase as $d2$ decreases. As a preferable range of $d2$, it is preferable that $d2$ be as small as possible with respect to the thickness $d1$ of the porous insulating layer, while, it is preferable that $d2$ be greater than the pore size in the porous insulating layer or the particle diameter when the porous material is in the form of particles. That is, given that the pore size (or the particle size when the porous particles are used as the porous material) is $dp$, it is preferable that $dp < d2 < d1$. With this configuration, it is possible to minimize the irregularities caused by the porous material.

As the surface roughness of the non-porous insulating layer, it is preferable that R<0.5×δ where R represents the mean square surface roughness, formed in a wiring width direction, of a portion of the insulating layer that is in contact with a wiring line of the wiring layer and δ represents a skin depth of a current flowing in the wiring line. Herein, given that the frequency of a signal is f, the magnetic permeability of a wiring material is μ, and the conductivity of the wiring material is σ, the skin depth δ is expressed as $\delta=\sqrt{(1/(\pi f \mu \sigma))}$.

With this configuration, it is possible to minimize the signal attenuation caused by a prolongation of a current path of a skin current due to the irregularities, thereby providing a multilayer circuit board excellent in high-frequency characteristics. dp<d2 is preferable also for realizing such a surface roughness.

Further, another configuration of this invention is such that the material selected from the foregoing porous material group is a particulate material having a diameter d where d<0.1×dc, wherein a minimum wiring thickness t1 or a minimum wiring width W1 of the wiring layer 3 in contact with the insulating layer, whichever is smaller, is given by dc, and this particulate material is dispersed in a synthetic resin to thereby form the porous insulating layer.

Even when the porous material is a non-particulate material such as a porous polymer, the function of this invention is not impeded. However, when a particulate material is used, the porous insulating layer can be formed by mixing the particulate material into a synthetic resin and therefore it is preferable in view of simplifying a manufacturing process. In this case, in order to uniformly expect an effect of the particulate material from the wiring line formed in the wiring layer, it is preferable that the particulate material be sufficiently small with respect to the wiring width and, according to the studies by the inventors of this invention, it is sufficient if d<0.1×dc.

In order to sufficiently obtain the effect of the porous material, it is preferable that the relative permittivity of the synthetic resin itself be small. Such a material may be preferably one of an epoxy resin, a phenol resin, a polyimide resin, a polyester resin, a fluorine resin, a denatured polyphenylether resin, a bismaleimide triazine resin, a denatured polyphenylene oxide resin, a silicon resin, an acrylic resin, a benzocyclobutene resin, a polyethylene naphthalate resin, a polycycloolefin resin, a polyolefin resin, a cyanate ester resin, a melamine resin, and an acrylic resin. Among these materials, the polyolefin resin, the polycycloolefin resin, the fluorine resin, or the like is more preferable because the water absorbency is small and the time-dependent change in relative permittivity is small.

Now, specific examples of this invention will be described.

EXAMPLE 1

Figure 3:
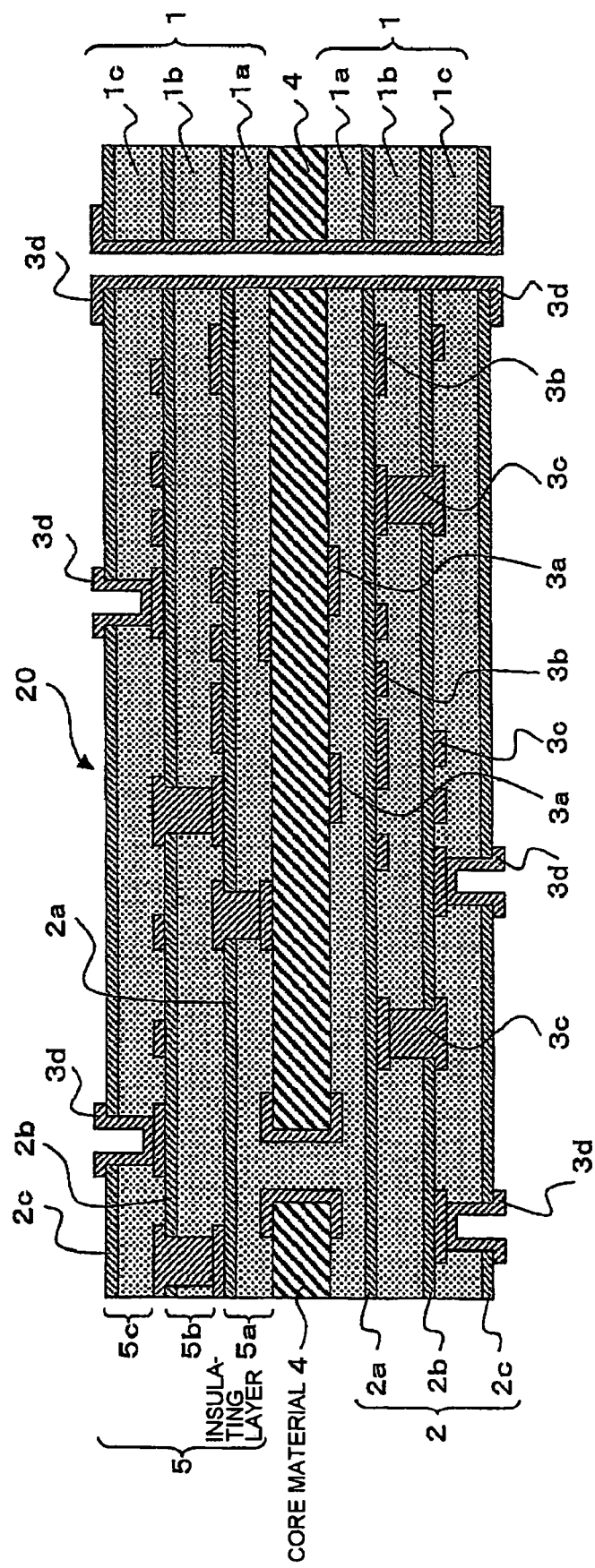
FIG. 3 is a schematic diagram showing a sectional structure of a multilayer circuit board in Example 1 of this invention.

Example 1 of this invention will be described with reference to the figures. FIG. 3 is a schematic diagram showing a sectional structure of a multilayer circuit board in Example 1 of this invention, wherein the board is configured to have, on both sides of a core material 4 for maintaining the mechanical strength of the board, plural wiring layers 3 and insulating layers 5 between the wiring layers 3. Each insulating layer 5 comprises a porous insulating layer 1 and a non-porous insulating layer 2. This multilayer circuit board 20 was formed in the following manner.

Figure 4:
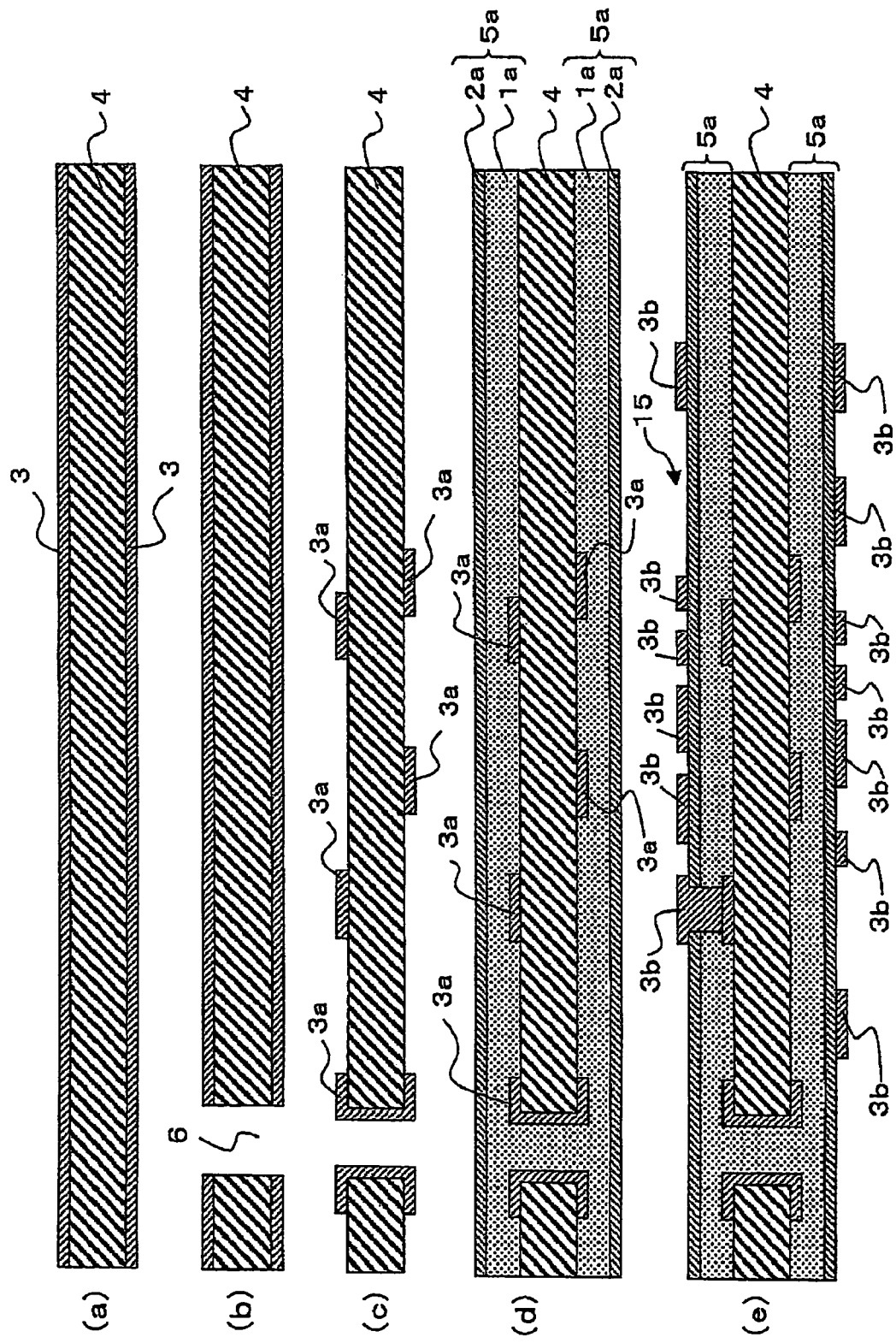
FIGS. 4 (a), (b), (c), (d), and (e) are sectional end views showing, in order, manufacturing processes of the multilayer circuit board of FIG. 3.

At first, as shown in FIG. 4(a), as a core material 4, a glass epoxy copper-clad laminated plate was prepared which had a resin-portion thickness of 100 μm and a copper thickness of 35 μm. Then, as shown in FIG. 4(b), a through hole 6 for achieving electrical connection between both sides of the core material 4 was formed at a predetermined position using a drill, a router machine, or the like. Then, by immersion in an 80° C. alkaline sodium permanganate solution (manufactured by Ebara Densan Ltd.), a desmear treatment was performed according to a known technique. A neutralization treatment was performed according to a known technique using a hydroxylamine sulfate-based neutralizing solution (manufactured by Ebara Densan Ltd.). Then, after degreasing and cleaning the copper surfaces, a palladium chloride solution treatment and a palladium reduction treatment using dimethylamine borane were successively performed as a catalytic treatment according to a known technique, thereby applying a palladium catalyst thereto. Thereafter, electroless copper plating was performed according to a known technique, thereby copper-plating the inside of the through hole and the surfaces of the copper-clad laminated plate. After bonding dry film resists, exposure was performed using a predetermined mask pattern according to a photolithography method, thereby obtaining first wiring layers 3a as shown in FIG. 4(c).

Then, as shown in FIG. 4(d), laminates, each of which was made of a porous insulating layer 1 and a non-porous insulating layer 2, were pressed at 135° C. with a pressing pressure of 1 MPa for 1 minute in a vacuum of 0.1 atm using a vacuum laminator so as to be laminated on both sides of the base plate and then were heat-treated in a 150° C. $N_2$-atmosphere oven so as to be cured, thereby obtaining first insulating layers.

The laminate of the porous insulating layer 1 and the non-porous insulating layer 2 was formed in the following manner.

At first, a porous material, such as a porous silica or a hollow silica, having pores inside was mixed and dispersed, along with a surfactant, into a 1:1 volume ratio mixed solvent of xylene and methyl ethyl ketone, thereby obtaining a porous material slurry. In this example, porous silica particles with a particle size of 50 nm were used. For the mixing/dispersion, a planetary stirrer, a homogenizer, or ultrasonic irradiation can be suitably used. Then, using a planetary stirrer, the porous material slurry was mixed into a resin varnish obtained by dissolving a precursor of a thermosetting polyolefin resin into a 1:1 volume ratio mixed solvent of xylene and methyl ethyl ketone. In the mixing, the porous silica was in an amount of 70 parts by weight with respect to 100 parts by weight of the solid resin varnish. Although the mixing ratio can be optionally adjusted depending on the effective permittivity of a porous insulating layer to be obtained, 10 parts by weight to 100 parts by weight are preferable. If the mixing amount of the porous silica is small, it is difficult to obtain the permittivity reduction effect of this invention, while, if it is large, breakage or the like occurs, thus not preferable in terms of workability. An obtained porous material-dispersed resin varnish was cast-molded using a doctor blade or the like and treated in a 90° C. $N_2$ oven for 30 minutes to evaporate the excessive solvent, thereby obtaining a 25 μm porous insulating layer dry film. Then, a resin varnish obtained by dissolving a precursor of a thermosetting polyolefin resin into a 1:1 volume ratio mixed solvent of xylene and methyl ethyl ketone was laminated on the dry film by the casting method and treated in a 90° C. $N_2$ oven for 30 minutes to evaporate the excessive solvent, thereby obtaining a laminate of a porous insulating layer 1 and a non-porous insulating layer 2 having a total thickness of 30 μm. In the formation of this laminate, relative permittivities ε1 and ε2 of individual cured bodies of a porous insulating layer 1 and a non-porous insulating layer 2 separately formed by the same methods (individual cured bodies obtained by curing a porous insulating layer 1 of 100

μm and a non-porous insulating layer dry film at 150° C., respectively) were measured by a cavity resonator perturbation method to be ϵ1=1.6 and ϵ2=2.5 at 10 GHz. In Example 1 of this invention, the porous insulating layer 1 and the non-porous insulating layer 2 were laminated by the casting method, but use may be made of lamination by a roll-to-roll method or of a technique of breeding out a resin single layer at the surface layer using the convection or flow of a resin generated by heat treatment in curing baking. Further, although the non-porous insulating layer 2 was provided on one side of the porous insulating layer 1 in Example 1 of this invention, the function of this invention can be achieved even if provided on both sides thereof.

A via hole leading to the first wiring layer 3a was formed in the formed first insulating layer 5 by a known technique. As the known technique, use can be preferably made of a carbon dioxide laser, a YAG laser, a harmonic YAG laser, an excimer laser, or the like. Then, as shown in FIG. 4(e), the desmear treatment, the neutralization treatment, the catalytic treatment, and the electroless plating were carried out in the same manner as described above, thereby forming second wiring layers 3b. Known electroplating may be used according to necessity. A known semi-additive method may be used for formation of a fine wiring pattern.

After obtaining second insulating layers 5b, third wiring layers 3c, and third insulating layers 5c by repeatedly using the foregoing techniques, via holes were formed by the foregoing laser, a through hole for achieving electrical connection between the front and back sides of the base member was processed using a drill, a router, or the like, and fourth wiring layers were obtained by the same techniques as described above, thereby obtaining the structure shown in FIG. 3.

Thereafter, solder resists were coated on both surfaces of the obtained circuit board, openings were provided at external take-out terminal portions by a photolithography method, and terminal electrodes (not shown) were formed by a known nickel plating method or metal plating method, thereby obtaining a multilayer circuit board of this example.

EXAMPLE 2

In Example 1 described above, use was made of the technique of dispersing the particulate substance such as the porous silica or the hollow silica into the resin to form the porous insulating layer. However, use may be made of a plate-like molded product of the porous silica, the hollow silica, or the like having a plate shape or a film shape. In this case, the plate-like molded product is used as a porous insulating layer and a non-porous insulating layer of a resin or the like is formed on at least one surface thereof by a lamination method or the like, thereby obtaining an insulating layer of the example of this invention.

A plate-like molded product forming method is such that the plate-like molded product is obtained by, according to a known technique, mixing hollow particles such as a hollow resin or the like, for example, the porous silica, the hollow silica, silica particles, a particulate cured resin, a resin precursor, or the like and a binder component such as silicic acid and then baking them.

With this configuration, since pores inside the particles and pores between the particles both can be used, it is possible to efficiently achieve a reduction in permittivity while maintaining the mechanical strength.

In this case, it is preferable that there be a relationship of t1<d2 between the wiring thickness t1 and the non-porous insulating layer thickness d2. With this configuration, the non-porous resin flows into between the wiring lines in the formation of the laminate as the multilayer board and thus it becomes possible to obtain excellent adhesiveness and strength.

A polyolefin resin having a relative permittivity of 2.2 was laminated to a thickness of 25 μm on each of both sides of a porous silica plate having a thickness of 100 μm and a porosity of 50% using the lamination method, thereby obtaining an insulating layer of Example 2 of this invention. The relative permittivity of this insulating layer was measured by a parallel-plate method to be 2.0. Further, the thermal expansion coefficient of this insulating layer in a direction parallel to the surface thereof was measured by a TMA method to be 10 ppm/° C. near room temperature, while it was 60 ppm/° C. in the case of the polyolefin resin alone. According to the example of this invention, it is possible to improve the thermal properties while reducing the relative permittivity.

EXAMPLE 3

Multilayer circuit boards were manufactured using the foregoing technique of Example 1 while changing the filling amount of the porous silica in a porous insulating layer from 0 parts by weight (no addition) to 100 parts by weight. The insulating layer thickness was set to 30 μm equal to that in Example 1 The wiring thickness was set to 15 μm. The effective relative permittivity of laminates of porous insulating layers 1 with respective parts by weight of the porous silica and non-porous insulating layers 2 was measured and the characteristics of FIG. 5 were obtained.

Figure 5:
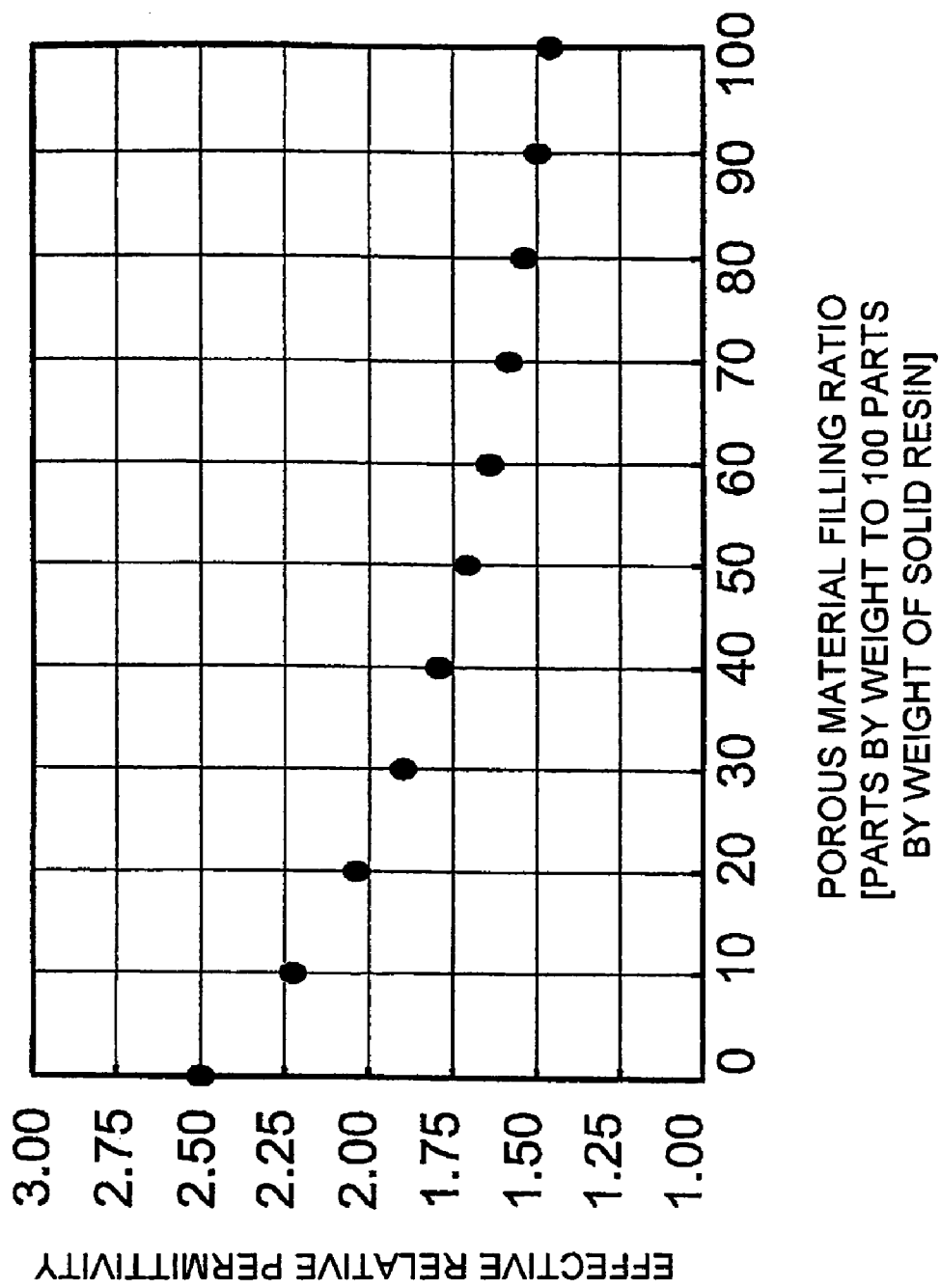
FIG. 5 is a diagram showing measured values of effective relative permittivity of laminates of porous insulating layers and non-porous insulating layers of multilayer circuit boards according to Example 3 of this invention.

From FIG. 5, it is shown that the effective relative permittivity can be reduced by introducing the porous material.

Figure 6:
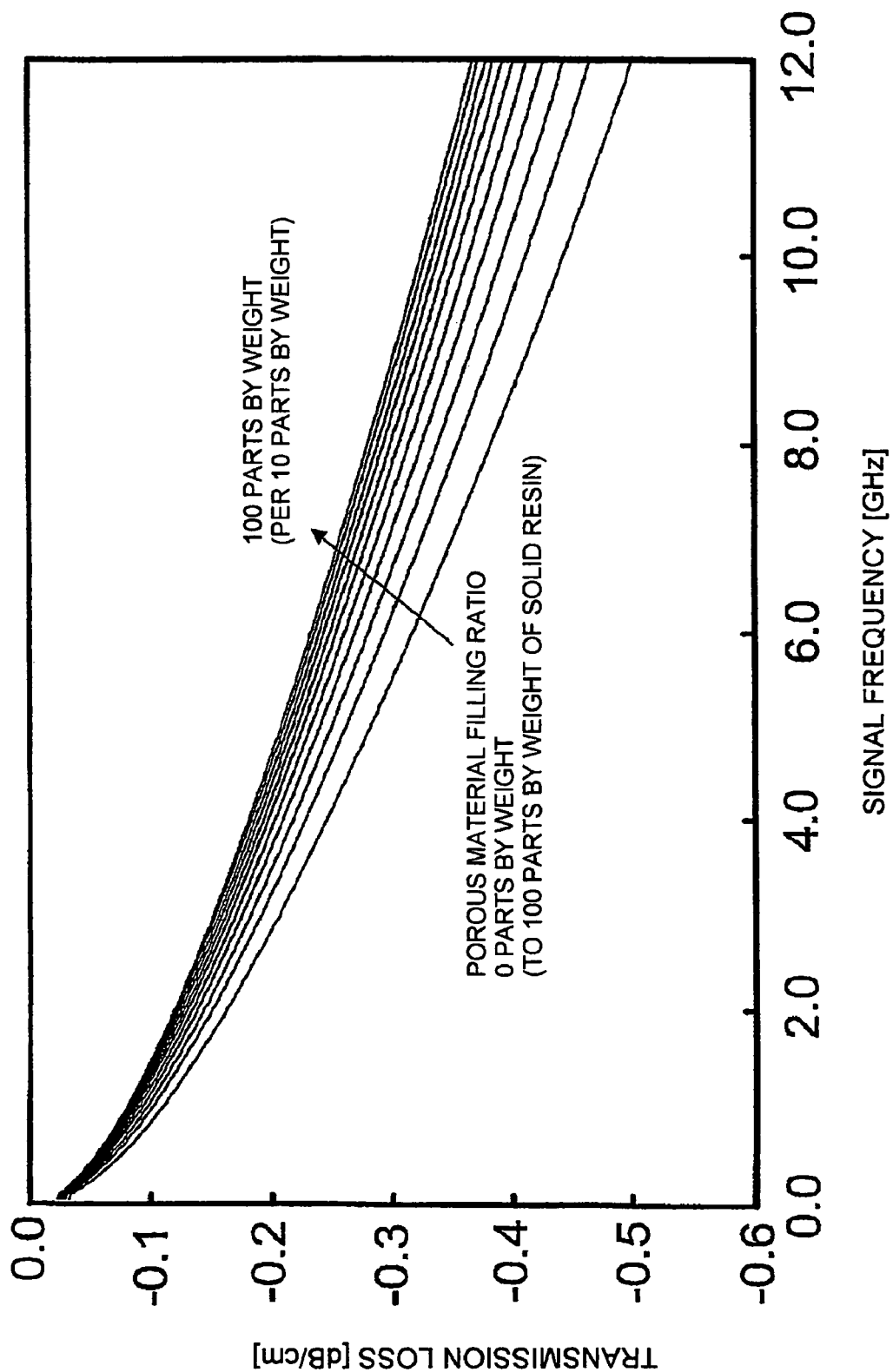
FIG. 6 is a diagram showing the transmission loss characteristics of the multilayer circuit boards according to Example 3 of this invention.

FIG. 6 shows the results of measuring the signal transmission characteristics of these circuit boards. The measurement was performed for wiring patterns each having a microstripline shape and a characteristic impedance of 50Ω, using a network analyzer. It is shown that the high-frequency loss can be reduced following the reduction in effective relative permittivity, so that the upper limit of usable frequency of the circuit board is improved. By containing the porous material, no problem arises in connection with irregularities or wiring pattern defect which has conventionally occurred.

EXAMPLE 4

A multilayer circuit board was prepared for comparison using the same technique as that in Example 1, but with no formation of a non-porous insulating layer 2, and the signal transmission characteristics thereof were compared with those of the multilayer circuit board obtained in Example 3 described above. The content of the porous silica was set to 70 parts by weight equal to that in Example 1. In order to set the insulating layer thickness to be equal to that of the multilayer circuit board obtained in Example 3, the thickness of a porous insulating layer was set to 30 μm.

Figure 7:
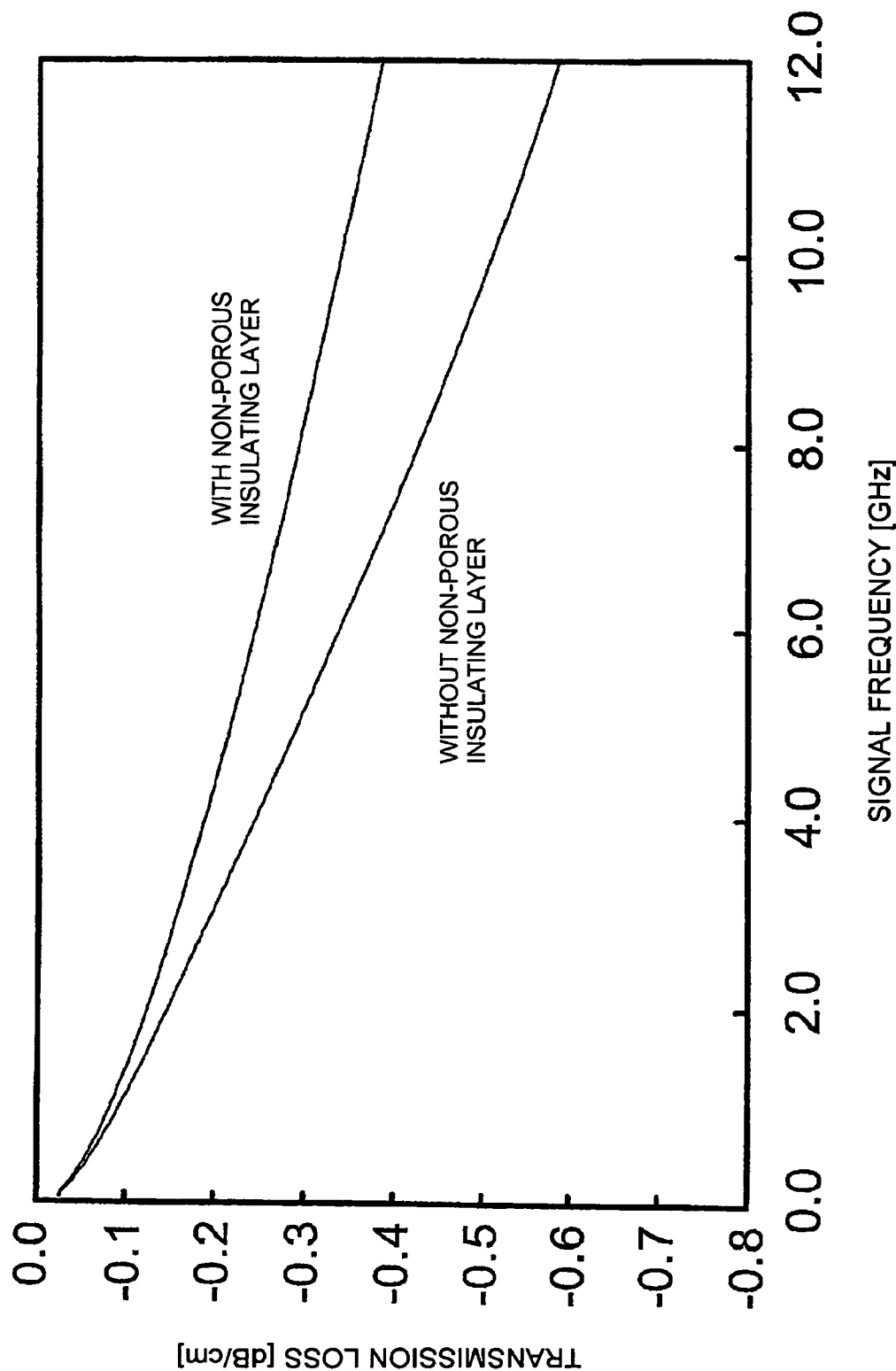
FIG. 7 is a diagram showing the transmission loss characteristics of a multilayer circuit board according to Example 4 of this invention, wherein the characteristics of a multilayer circuit board of Comparative Example with no formation of a non-porous insulating layer are also shown for comparison.

The surface roughness of a portion, in contact with a wiring line, of the insulating layer with no formation of the non-porous insulating layer 2 (i.e. only the porous insulating layer) was measured to be 2.5 μm in mean square roughness (Rrms) (Comparative Example). On the other hand, the surface roughness of a portion, in contact with a wiring line, with the formation of the non-porous insulating layer 2 was measured to be 50 nm in mean square roughness (Rrms). FIG. 7 shows the results of measuring the signal transmission characteristics of both. It is shown that the high-frequency loss can be reduced by forming the non-porous insulating layer.

INDUSTRIAL APPLICABILITY

As described above, a multilayer circuit board according to this invention is optimal as a circuit board, for mounting thereon circuit elements such as an LSI, of an electronic device.

The invention claimed is:

1. A multilayer circuit board comprising, on a base member, plural wiring layers and at least one insulating layer located between said plural wiring layers, at least part of said insulating layer comprising a porous insulating layer and a non-porous insulating layer formed on at least one surface of said porous insulating layer,
wherein
said plural wiring layers are formed on said non-porous insulating layer and buried in said porous insulating layer,
said porous insulating layer contains at least one of porous insulating materials selected from a porous material group consisting of a porous substance, an aerogel, a porous silica, a porous polymer, a hollow silica, and a hollow polymer, and
said non-porous insulating layer is free from said porous material group.

2. The multilayer circuit board according to claim 1, wherein said porous insulating layer and said non-porous insulating layer satisfy a relationship of $\epsilon 1/d1 < \epsilon 2/d2$, where a relative permittivity and a thickness of said porous insulating layer are given by $\epsilon 1$ and $d1$, respectively, and a relative permittivity and a thickness of said non-porous insulating layer are given by $\epsilon 2$ and $d2$, respectively.

3. The multilayer circuit board according to claim 1, wherein said porous insulating layer and said non-porous insulating layer satisfy a relationship of $d1 > d2$, wherein a thickness of said porous insulating layer is given by $d1$ and a thickness of said non-porous insulating layer is given by $d2$.

4. The multilayer circuit board according to claim 3, wherein said porous insulating layer and said non-porous insulating layer satisfy a relationship of $dp < d2$, wherein an average pore size in said porous insulating layer or a particle diameter when said porous material is a particulate material, whichever is larger, is given by $dp$ and the thickness of said non-porous insulating layer is given by $d2$.

5. The multilayer circuit board according to claim 1, wherein said insulating layer and said wiring layer have a relationship of $R < 0.5 \times \delta$, where R represents a mean square surface roughness, formed in a wiring width direction, of a portion of the insulating layer that is in contact with a wiring line of said wiring layer and $\delta$ represents a skin depth of a current flowing in said wiring line.

6. A multilayer circuit board comprising, on a base member, plural wiring layers and at least one insulating layer located between said plural wiring layers, at least part of said insulating layer comprising a porous insulating layer and a non-porous insulating layer formed on at least one surface of said porous insulating layer,
wherein said porous insulating layer contains at least one of porous insulating materials selected from a porous material group consisting of a porous substance, an aerogel, a porous silica, a porous polymer, a hollow silica, and a hollow polymer, said non-porous insulating layer being free from said porous material group, and
wherein the porous insulating materials selected from said porous material group are a particulate material having a diameter d satisfying $d < 0.1 \times dc$, where a minimum wiring thickness $t1$ or a minimum wiring width $W1$ of said wiring layer in contact with said insulating layer, whichever is smaller, is given by $dc$, and that said particulate material is dispersed in a synthetic resin to thereby form said porous insulating layer.

7. The multilayer circuit board according to claim 6, wherein said synthetic resin is at least one selected from the group consisting of an epoxy resin, a phenol resin, a polyimide resin, a polyester resin, a fluorine resin, a denatured polyphenylether resin, a bismaleimide triazine resin, a denatured polyphenylene oxide resin, a silicon resin, an acrylic resin, a benzocyclobutene resin, a polyethylene naphthalate resin, a polycycloolefin resin, a polyolefin resin, a cyanate ester resin, a melamine resin, and an acrylic resin.

8. An electronic device using the multilayer circuit board according to claim 1.

9. The multilayer circuit board according to claim 1, wherein signal attenuation in a microstrip line is 0.5 dB/cm or less at an operating frequency of 10 GHz, the microstrip line having a characteristic impedance of 50Ω.

10. An electronic device using the multilayer circuit board according to claim 9.

* * * * *